United States Patent [19]

Fu et al.

[11] 4,356,040
[45] Oct. 26, 1982

[54] SEMICONDUCTOR DEVICE HAVING IMPROVED INTERLEVEL CONDUCTOR INSULATION

[75] Inventors: Horng-Sen Fu, Sunnyvale, Calif.; Al F. Tasch, Jr., Richardson; Pallab K. Chatterjee, Dallas, both of Tex.

[73] Assignee: Texas Instruments Incorporated, Dallas, Tex.

[21] Appl. No.: 146,938

[22] Filed: May 2, 1980

[51] Int. Cl.³ ................ H01L 21/70; H01L 21/26
[52] U.S. Cl. ................................. 148/1.5; 29/571; 29/578; 148/187; 357/23; 357/41; 357/91
[58] Field of Search ............... 148/1.5, 187; 29/571, 29/578; 357/23, 41, 91

[56] References Cited

U.S. PATENT DOCUMENTS

| | | | |
|---|---|---|---|
| 3,996,658 | 12/1976 | Takei et al. | 29/571 |
| 4,112,575 | 9/1978 | Fu et al. | 29/577 C |
| 4,131,906 | 12/1978 | Kinoshita | 357/41 |
| 4,149,307 | 4/1979 | Henderson | 29/571 |
| 4,182,023 | 1/1980 | Cohen et al. | 29/571 |
| 4,210,473 | 7/1980 | Takagi et al. | 148/189 |
| 4,213,139 | 7/1980 | Rao | 357/41 |
| 4,251,571 | 2/1981 | Garbarino et al. | 427/89 |

Primary Examiner—Upendra Roy
Attorney, Agent, or Firm—Melvin Sharp; Richard L. Donaldson; Thomas W. DeMond

[57] ABSTRACT

A semiconductor device and method of manufacture employs an improved insulating layer to laterally separate conductive layers or regions. A relatively thick insulating layer is anisotropically patterned to form an electrode having a thick insulating layer on its side walls. Subsequently defined conductive regions are separated from the electrode by a distance determined by the thickness of the insulating layer. In devices requiring multiple level polycrystalline silicon electrodes, shorts between electrodes are reduced; in MOS devices, operating parameters are improved due to decreased overlap of the gate electrode over the source or drain region, decreased contamination of the gate electrode during manufacture, and more uniform gate oxide definition along the active channel between the source and drain.

7 Claims, 26 Drawing Figures

SEMICONDUCTOR DEVICE HAVING IMPROVED INTERLEVEL CONDUCTOR INSULATION

BACKGROUND OF THE INVENTION

This invention relates to semiconductor devices and methods of manufacture and more particularly to semiconductor devices having improved insulation between interlevel conductive layers. In one aspect of the invention, the insulator thickness formed on the edge of an electrode is enhanced to improve the insulation between that electrode and a laterally spaced conductive region.

Semiconductor devices are widely used throughout the electronics industry and application of semiconductor devices has dramatically increased in other industries such as games, automotive applications, industrial controls, etc. One of the major reasons for increased application of semiconductor devices is directly attributable to the dramatic reduction in production costs achieved by the electronics industry during recent years. This is vividly illustrated in application of semiconductor devices to the computer industry where there has been a demand for more and more storage capacity in the form of high density, low cost memories. For example, in the past 10 years semiconductor memories have been developed where the number of bits of storage per semiconductor chip has increased from 16 to 64 K. At the same time, the cost per bit has been reduced by a factor of approximately 200. By increasing the density of semiconductor elements on a single chip, the manufacturing costs can be dramatically decreased. To illustrate, the production cost of a semiconductor memory lies primarily in the bonding, packaging, testing and handling operations, rather than in the cost of the silicon chip which contains the actual circuitry. As a result, any circuit which can be contained within a given chip size; for example, 30,000 square mils, will cost about the same as any other. Thereby by forming large numbers of memory cells in a single chip, large economies in the cost per bit can result, assuming reasonable yields can be obtained. However, as the density and complexity of the chip increases, the yield decreases, offsetting some of the advantage otherwise obtainable from high packing density.

Recognizing the tremendous cost reduction potential that can be achieved by increasing density of semiconductor devices formed on a single chip, the electronics industry has focused a great deal of attention toward the design and manufacture of integrated circuits characterized by extremely high density complex circuitry. Such circuits are commonly referred to as very large scale integration devices (VLSI). The progress of the electronics industry in increasing density of semiconductor devices is evident in viewing the progression of dynamic random access memories from a storage capability of 4 K bits typically available in 1975 to 64 K bits announced by several companies in 1979. The size of the 64 K bit chip is normally the same size as the 4 K chip.

As device geometries have become smaller to accommodate the higher packing density, several problems have become manifest. These problems significantly reduce yields and offset the cost savings achieved by higher packing density. One of the most difficult problems encountered in manufacturing small geometry devices relates to interlevel shorts. This has been a particularly difficult problem in the manufacture of VLSI metal insulator semiconductor devices where the gate insulator is of a thickness much less than 1000 angstroms—for example, on the order of 200 angstroms or less. Hereinafter this category of integrated circuits will be referred to generally as MOS devices, and is intended to include the various types of such devices, both N-channel and P-channel, metal gate, silicon gate, silicon oxide gate insulator and other gate insulator devices known in the art, and related devices structures, such as CCD (charge coupled devices) and CID (charge injection devices). In such MOS devices, a common failure mode is for a doped region in the substrate, such as the source or drain region of an MOS transistor, to short through the thin insulating layer to the gate or control electrode. A related type problem in such devices relates to shorts between laterally spaced conductors formed on the surface of a substrate. This latter problem is common in devices requiring double-level conductors. Such conductors conventionally may be polycrystalline silicon. Devices of this type are described in the following pending patent applications, all assigned to Texas Instruments: Ser. No. 648,594, filed Jan. 12, 1976 by Clinton Kuo; Ser. No. 722,841, filed Sept. 13, 1976 by Clinton Kuo issued as U.S. Pat. No. 4,240,092; Ser. No. 754,144, filed Dec. 27, 1976 by L. S. Wall issued as U.S. Pat. No. 4,112,509; and Ser. No. 762,613, filed Jan. 26, 1977 by D. J. MacElroy issued as U.S. Pat. No. 4,151,021. In addition, a double-level polysilicon structure is shown in *Electronics*, Feb. 19, 1976, at pages 116–121.

In forming devices such as described in the aforementioned prior art applications, conventional semiconductor processing does not permit forming a sufficient thickness of insulation between the two levels of polysilicon conductors. As will be described in more detail below, the interlevel insulator thickness between the two levels of polysilicon conductors is typically limited to about 1.4 times the gate oxide thickness of the MOS device. For VLSI applications, this restriction is particularly severe since the gate insulator may be on the order of 200 angstroms or less, and the resulting insulation layer of about 280 angstroms laterally separating two conductors is subject to a high failure rate and is characterized by unacceptably low breakdown voltage limitations.

Another problem that has become manifest, particularly in MOS VLSI-type structures is excessive overlap of the gate electrode over source and drain regions. Even though it is typical in conventional processing to use self-aligned structures, there is significant lateral diffusion or scattering (during ion implant) of the impurities used to form the source and drain regions of an MOS transistor under the gate region of the device. For example, even if the source and drain regions are formed by ion implantation, it is not uncommon for there to be a lateral scattering of the ions by as much as 1000 angstroms. This reduces the effective gate length and increases the capacitance of the device thereby decreasing the speed of operation. These problems become more critical when extremely small geometry devices are being manufactured.

A further problem that has been encountered in conventional processes used to manufacture small geometry or VLSI type devices relates to contamination formed at the edges of the gate electrodes in MOS devices. Such contamination adversely affects device performance and significantly decreases yield.

An additional problem encountered, particularly in MOS type devices has been referred to in the art as "birds beaking". This refers to a MOS structure where the gate oxide thickness at the edges of a gate electrode increases during manufacturing steps involving oxidations which are performed subsequent to formation of the gate and gate oxide. This results in a non-uniform gate oxide thickness underneath the gate and adversely affects device operation. This "birds beaking" problem is particularly acute in devices requiring double level polysilicon structures.

As can be appreciated by those skilled in the art, these above described problems all adversely affect yield and increase manufacturing costs of semiconductor devices.

It is therefore a principle object of the present invention to provide an improved semiconductor structure characterized by fewer interlevel conductor shorts by enhancing the insulator thickness on the edges of electrodes. It is a further object of the invention to provide an improved MOS semiconductor device having reduced gate overlap. A further object of the invention is to provide an MOS structure having a gate electrode, the edges of which are protected from contamination in manufacturing steps subsequent to formation of the gate. An additional object of the invention is to provide an MOS structure having a more uniform gate oxide thickness along the channel from the source to the drain the thickness of which is not significantly affected by subsequent processing.

SUMMARY OF THE INVENTION

In accordance with the present invention, an improved semiconductor device is provided wherein a relatively thick insulating layer is formed on the side wall of a conductor. In one example of the invention, the semiconductor device includes a substrate having an insulating layer formed on its surface. The device includes first and second laterally separated conductive regions, at least one of the regions being formed to overlie the insulating layer. The other region may be formed in the substrate or may also be formed on the insulating layer. A second insulating layer is formed on the edge of the first conductive region to enhance the thickness of insulation laterally separating the first and second conductive regions. The second insulating layer is formed such that it is substantially thicker than the first insulating layer. In accordance with a further embodiment of the invention, a method is provided for manufacturing an improved semiconductor device including the steps of forming a conductive layer on a substrate, patterning the layer to form at least one electrode and forming a conformant insulating layer over the electrode. Portions of the insulating layer are then anisotropically removed to produce an electrode having an insulating layer on the side wall which is substantially the same thickness as the original conformal insulating layer.

In a preferred embodiment of the invention, an improved method for manufacturing a MOS semiconductor device is provided wherein a first relatively thin gate insulating layer is formed on the surface of a semiconductor substrate. A polysilicon conductive layer is formed to overlie the first gate insulating layer and is patterned to define a gate electrode. An insulating layer substantially thicker than the first gate insulating layer is formed to cover the gate electrode and conform to its structure. The conformant insulating layer is then anisotropically removed such that the insulating material remains on the side walls of the gate electrode but is removed elsewhere. Source and drain regions are then formed by ion implantation, the gate electrode and thick side wall insulation regions masking the ions from the underlying semiconductor substrate, producing MOS transistors having gate electrodes, which do not overlap the source and drain regions.

In a further embodiment of the invention an improved MOS structure having double level polysilicon conductors is provided. In this embodiment, a first relatively thin gate insulating layer is formed on the surface of a semiconductor substrate. A polysilicon conductive layer is formed to overlie the first gate insulating layer and a second relatively thick insulating layer is formed to overlie the polysilicon layer. The second insulating layer and polysilicon layer are then patterned to define a gate electrode which is separated from the substrate by the first relatively thin insulating layer, the top surface of the gate electrode being covered by the second insulating layer. A third conformant insulating layer is then formed to overlie the gate electrode and its overlying insulating layer. The third insulating layer is then ansotropically patterned to remove all of the material except that on the side walls of the gate electrode and its overlying insulating layer to produce an electrode structure having relatively thick insulating material on the side walls thereof. At least a portion of said the first insulating layer is then removed to expose region of the substrate surface adjacent the gate electrode, separated from its underlying substrate portion of the thickness of said insulating material on the side wall thereof. A second relatively thin gate insulating film is formed on the substrate and a second polysilicon layer is formed to overlie the substrate and at least a portion of the first gate electrode. The first gate electrode and the second polysilicon layer are laterally separated by the relatively thick insulating layer which was formed on the side walls of the first gate electrode.

IN THE DRAWINGS

The novel features believed characteristic of the invention are set forth in the appended claims. The invention itself, however, as well as other features and advantages thereof may best be understood by reference to the following detailed description of illustrative embodiments when read in conjunction with the accompanying drawings wherein:

FIG. 7a is an enlarged sectional view illustrating a CCD structure in accordance with an embodiment of the present invention producing uniform gate insulator thickness, and FIGS. 7b and 7c illustrate surface potentials associated with the structure of FIG. 7a;

DETAILED DESCRIPTION OF SPECIFIC EMBODIMENT

Figure 1:
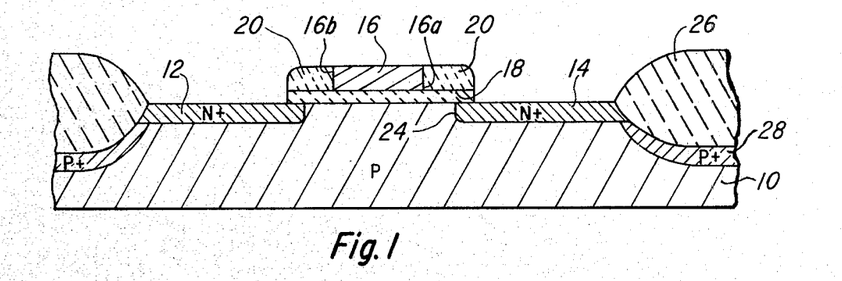
FIG. 1 is an enlarged sectional view of one embodiment of the invention.

Referring now to FIG. 1, a semiconductor device in accordance with the present invention may comprise an N-channel MOS transistor. While only one device is illustrated, it will be appreciated that typically a large number of such devices would be formed on the same semiconductor substrate. As is well known to those skilled in the art, such devices have utilization in a variety of semiconductor device applications. While an N-channel device is illustrated, it will be apparent that the invention can be utilized in P-channel devices as well.

In the N-channel device illustrated, the substrate 10 may typically comprise P-type monocrystalline silicon cut on the <100> crystallographic plane. The silicon may be P doped with boron while being grown and may have a resistivity of about 12 to 15 ohm-cm. The device includes source and drain regions 12 and 14 and typically may include a polysilicon gate 16 which is separated from the surface of the substrate 10 by a thin insulating region 18; the gate insulating region is typically formed of silicon dioxide and in small geometry devices may be on the order of 200 angstroms or less in thickness. The source and drain regions 12 and 14 may be formed by ion implantation. Since shallow junctions are desired for small geometry devices, it is advantageous to use arsenic ions during the implanting step to form the N+ source and drain regions. Using conventional techniques, an arsenic ion implant dose of $1-10 \times 10^{15}$ cm$^{-2}$ at 25–100 Kev is suitable for forming source and drain regions having a junction depth of about 1500 angstroms. In accordance with the invention, a relatively thick insulating region 20 is formed on the side wall 16b of the gate. The composite structure, that is the gate 16 with the relatively thick insulating layers 20 formed on the edge thereof, is used as a mask against the ion implantation used to form the source and drain regions 12 and 14. As is understood by those skilled in the art, there is a certain amount of lateral spread of the implanted ions underneath the gate oxide 18. This region illustrated at 22 may typically be a lateral distance on the order of up to 1000 angstroms. The thickness of the insulating layer 20 may extend to several thousand angstroms and in accordance with the invention, preferably is equal to or greater than the amount of lateral scattering of the ions. It can therefore be seen that the edge 24 of the implanted region 14 is still laterally spaced from the edge 16a of the gate. This lateral spacing is advantageous in that it reduces interlevel shorts between the gate 16 and the doped region 14 and 12. Further, the gate does not overlap either the doped region 12 or 14 and therefore capacitance is minimized, thereby improving speed of operation of the device. As a further advantage, the region 20 protects the edge 16a, 16b, of the gate 16 so that it is not contaminated during subsequent conventional processing of the device. The field oxide 26 and P+ channel stopper region 28 illustrated in FIG. 1 are conventional in the semiconductor industry and need not be described in more detail.

Figure 2:
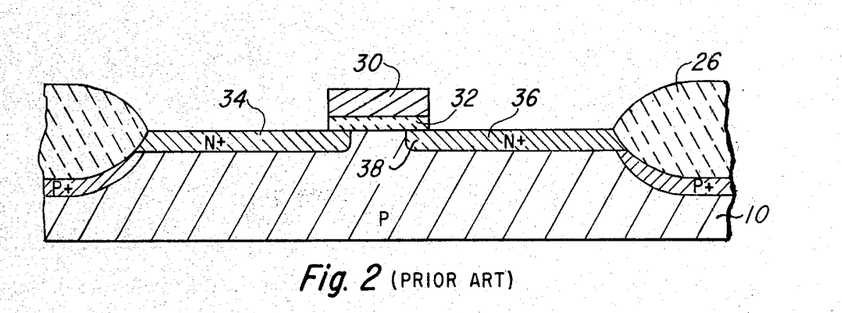
FIG. 2 is an enlarged sectional view illustrating a device of conventional manufacture.

Referring now to FIG. 2, an N channel MOS device of conventional manufacture is illustrated. In FIG. 2, a self-aligned gate structure is shown where the gate 30 and gate oxide 32 are used as a mask in forming the source and drain regions 34 and 36. Even if the source and drain regions 34 and 36 are formed by ion implantation, there is a lateral scattering of the ions underneath the gate 30 as shown in the region 38. Thus, the distance between the gate 30 and doped regions 34 or 36 is only the thickness of the gate insulator 32. In small geometry devices, as explained previously, this thickness may be on the order of 200 angstroms or less, and it is common for shorts to develop between the source or drain region 34 or 36 and the gate 30. Further, the gate 30 overlaps a portion of the doped regions 34 and 36, increasing gate capacitance and slowing the speed of operation of the device. Additionally, as can be seen, the edges of the gate 30 are exposed and may become contaminated during subsequent manufacturing steps such as metallization, overcoat protective layers, etc. Additionally since there is lateral extension of the doped regions 34 and 36 underneath the gate region 30, the dimensions of the gate 30 do not accurately define the gate length of the transistor; rather the length is only that portion separating the edges of the doped regions 34 and 36. Particularly in small geometry devices, this gate overlap becomes significant and adversely affects device operation.

Figure 3:
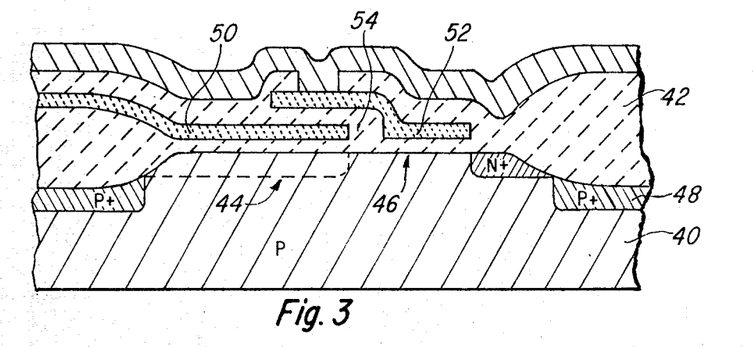
FIG. 3 is an enlarged sectional view of an embodiment of the invention illustrating a double level conductor system.
Figure 4:
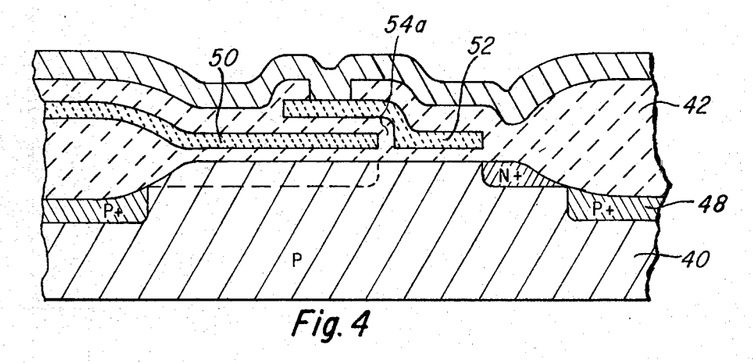
FIG. 4 is an enlarged sectional view illustrating a conventional double level interconnect system.

With reference to FIG. 3 there is illustrated in partial cross sectional view a portion of an integrated circuit utilizing two levels of interconnection. Such structures are common, for example, in electrically programmable read only memories and dynamic random access memories where double-level polysilicon processes are commonly employed. With reference to FIG. 3, there is shown by way of example one cell of a dynamic memory of the type generally illustrated in U.S. Pat. No. 4,152,779 that employs two levels of polysilicon conductors. The cell shown in FIG. 3 is an N-channel device and is formed on a P-type substrate 40. An insulating layer is formed on the surface of the substrate 40 and includes a relatively thick field (oxide) region 42 and a relatively thin (thin insulator) storage and transfer region 44 and 46. A channel stop region 48 is conventional and is formed in the substrate adjacent the relatively thick insulating region 42 having the same conductivity type as the substrate and an impurity concentration typically on the order of $5-25 \times 10^{15}$ atoms/cubic centimeter. A storage gate electrode 50 covers a first portion of the relatively thin insulating layer and extends in part over the thick insulating layer 42. A transfer gate electrode 52 overlies the transfer region 46 and is separated therefrom by the thin insulating layer and is also insulated from the storage gate electrode 50. In accordance with the present invention, the thickness of the insulating layer separating the storage electrode 50 and the transfer gate electrode 52 is formed to be relatively thick in the region 54. Forming a relatively thick insulating layer at the edge of the electrode 50 increases the lateral separation between the storage gate electrode 50 and the transfer gate electrode 52, thereby significantly decreasing shorts between these two electrodes. Using conventional N-channel, double level polysilicon processing techniques, it has heretofore not been feasible or practical to form a relatively thick insulating region as illustrated at 54. Rather as shown in FIG. 4, the thickness of the insulating layer 54a between the storage gate electrode 50 and the transfer gate electrode 52 is relatively narrow, typically limited to about 1.4× the thickness of the thin insulating layer in the regions 44 and 46, as will be more apparent in discussions of FIGS. 8 and 9 hereinafter. When the thin insulating layers in the regions 44 and 46 are substantially less than 1000 angstroms (e.g., 500 angstroms or less), such as is required in VLSI type devices, the thickness 54a separating the electrodes 50 and 52 is not sufficient and often results in interelectrode shorts or else results in a structure where the breakdown voltage between these two electrodes is not sufficiently large, thereby seriously reducing the yield and reliability of these type of devices.

Figure 5:
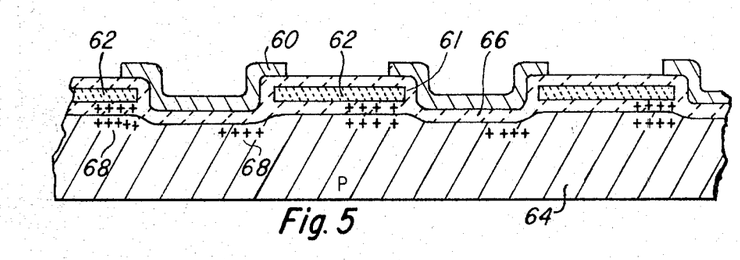
FIG. 5 is an enlarged sectional view diagrammatically illustrating a conventional CCD device having a non-uniform gate oxide thickness.

With reference to FIG. 5, a charge coupled device structure is illustrated which advantageously can be modified in accordance with the present invention to improve yield and device performance. The CCD structure illustrated in FIG. 5 is suitable for operation by a two-phase clock pulse which is applied to electrodes 60 and 62. CCD structures of this type are well known in the semiconductor art and are described in more detail, for example, in U.S. Pat. No. 4,027,381, issued in the name of Al Tasch, et al. In CCD structures such as illustrated in FIG. 5 it is advantageous to use a single insulating material 66 such as silicon dioxide to separate the gate electrodes 60 and 62 from the semiconductor substrate 64 as well as from each other. One of the common failure modes of CCD devices of this configuration is interelectrode shorts between electrodes 60 and 62. The most common failure is due to defects in the insulation formed on the side of the electrode 62, such as in region 61. In a further aspect of the CCD structure as illustrated in FIG. 5, it is particularly advantageous for all of the gate electrodes 60 and 62 to be separated from the underlying semiconductor substrate 64 by uniform thickness insulating layer 66. As described in more detail in the aforementioned U.S. Pat. No. 4,027,381, such a structure can be fabricated by selectively doping the insulating layer 66 and then out-diffusing the dopants during subsequent processing steps to form modified surface potential regions 68 in the surface of the substrate 64. In this technique it is important that the modified surface potential regions be self-aligned with the edge of the electrodes 60 and 62. Detailed processes for fabricating such a structure are described in the aforementioned patent.

Figure 6A:
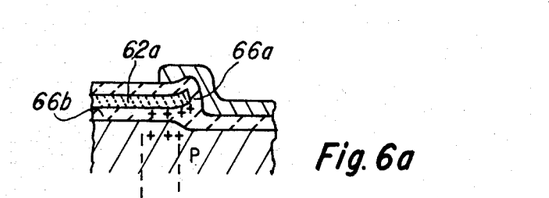
FIG. 6a is an enlarged view of a portion of FIG. 5 showing the non-uniform gate insulator.

One of the difficulties that has been encountered in such a structure, however, relates to a non-uniformity of the modified regions 68 in the surface of the semiconductor substrate 64. The reason for this non-uniformity is diagrammatically illustrated in FIGS. 6a, b and c. FIG. 6a is an enlarged cross sectional view of a portion of the structure shown in FIG. 5 illustrating the edge region of electrode 62a. As can be seen in this illustration, the thickness of the insulating region at the edge of electrode 62a—that is in the region 66a, is significantly thicker than the insulating region at 66b. It is believed that the reason for this non-uniformity in thickness is that during subsequent processing steps a portion of the polysilicon electrode 62a at the edge of the electrode is partially consumed by oxidation as is the underlying region in the semiconductor substrate. The net result of this effect is that during subsequent processing steps where out diffusion is required in order to form the modified surface potential regions 68 in the surface of the semiconductor substrate 64, the implanted ions at the edge of electrodes 62a do not out diffuse through the greater thickness of the insulating layer 66a, thereby forming a perturbation in the surface potential of the substrate 64. This perturbation is illustrated at 70 in FIG. 6b, which diagrammically illustrates the surface potential under the phase I electrode 62 and phase II electrode 60 when no potential is applied to either phase I or phase II electrodes. As is diagrammically illustrated in FIG. 6c, when a voltage is applied to the phase II electrode 60, the surface potential has a perturbation at 72 which restricts or impedes the transfer of charge along the surface of the substrate 64. This of course deleteriously affects the performance of the device.

Figure 6B:
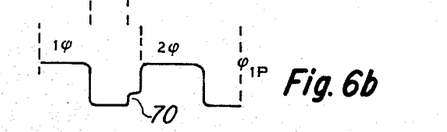
FIGS. 6b and 6c illustrate surface potentials produced by the structure of FIG. 5.
Figure 6C:
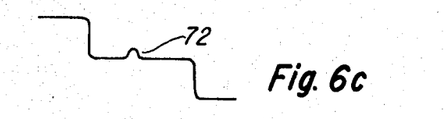
Figures 7A, 7B:
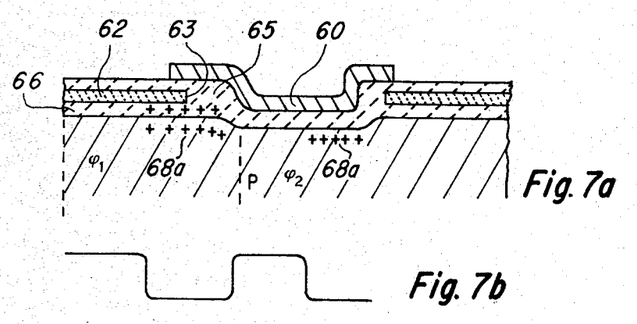
Figure 7C:
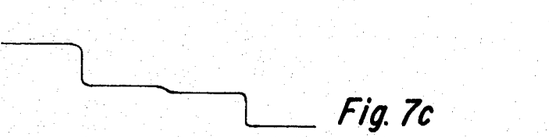

By utilizing the techniques of the present invention, however, it is possible to modify the CCD structure illustrated in FIG. 5 to produce an improved CCD device that is not affected by the non-uniform insulation thickness such as illustrated at 66a in FIG. 6, and does not have the thin insulating region 61 separating the two electrodes 60 and 62, but rather has a thicker insulating region formed on the side wall of the electrode 62, thereby decreasing interelectrode shorts and increasing yield and reliability of such devices. The modified CCD structure is illustrated in FIG. 7a where electrode 62 is separated laterally from electrode 60 by a relatively thick insulating portion 65. The region 65 is significantly thicker than the thickness of the insulating layer 66 in accordance with the present invention and thereby substantially reduces shorts between electrode 60 and 62. Further, in accordance with the invention the relatively thick insulating region 65 formed on the side of the electrode 62 overlies a portion of the insulating layer 66 which has been implanted with dopant ions. Thus, during subsequent processing the thickness of the insulating layer 66 underneath the edge 63 of electrode 62 is not changed. That is, the thickness underneath the electrode 62 of the insulating layer 66 remains uniform. Thus, during subsequent outdiffusion steps, the surface potential modified region 68a is uniform as is diagrammically illustrated in FIG. 7b. The surface potential under the phase I and phase II electrodes 62 and 60 contains no perturbations such as encountered at 70 in FIG. 6b. As further illustrated in FIG. 7c when the phase II electrode 60 is biased ON, there is no perturbation such as 72 in FIG. 6c to impede transfer of charge in the device.

Accordingly, by modifying the structure of a CCD device such as illustrated in FIG. 7a by forming a relatively thick insulating layer on the side of the electrode 62 it is possible to improve yield, reliability, and device performance. With reference now to FIGS. 8a–g, a method in accordance with the present invention will be described which is suitable for manufacturing devices having electrodes with a thick insulating layer on the side wall or edges, such as the device illustrated in FIG. 1. The process is basically compatible with convention N-channel, silicon gate self-aligned, double-level polysilicon processing typically used in manufacturing MOS integrated circuits. As will be understood by those skilled in the art, however, the invention is not limited to MOS or metal insulator semiconductor type devices, but is more generally suitable for any type of device where a thick insulating layer is required on the edge of an electrode. In this respect, the present invention is particularly advantageous over conventional semiconductor processing techniques in that it permits formation of a thick insulating layer on the side or edge of an electrode whereas conventional processing techniques are limited in the thickness of insulating material that can be formed on the edges. This is true because in a conventional process, self-aligned techniques are utilized wherein the electrode is patterned with photoresist and etched down to the surface of the substrate. This processing technique, of course, leaves the edges of the electrode exposed. In a typical process, a new insulating layer is typically grown by thermal oxidation techniques over the exposed areas of the silicon. If, for example, the new thermally grown oxide is formed to a thickness of 200 angstroms, the edges of the polysilicon electrode will also be oxidized. Since the polysilicon electrode is typically doped to be conductive, it oxidizes at a faster rate than the surface of the silicon substrate. Using doping concentrations that are typical in semiconductor industry, for a thermal oxidized layer of 280 angstroms formed on the surface of a semiconductor substrate, the depth of oxidation of the polysilicon electrode will be about 1.4 times that thickness, or 280 angstroms. This limitation is avoided in the present invention as will be apparent from the following description of the process described in FIGS. 8a-8g.

Figure 8A:
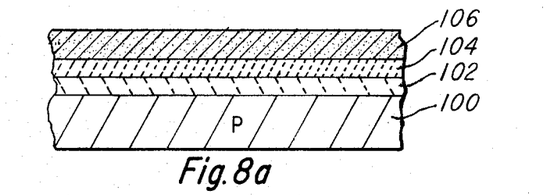
FIGS. 8a–8g illustrate a process in accordance with the present invention suitable for manufacturing the device shown in FIG. 1.
Figure 8B:
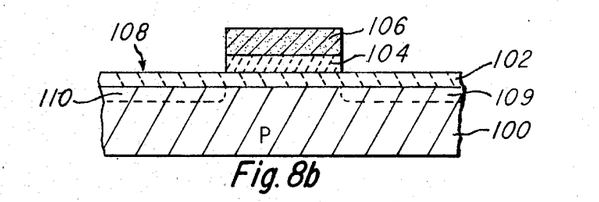

With reference to FIG. 8a, the starting material is typically a slice of p-type monocrystalline silicon, perhaps 4 inches in diameter and 20 mils thick, cut on the <100> crystallographic plane. The crystal may be p-type doped with boron in growing to a resistivity of about 12-15 ohm-cm. In FIGS. 8a-8g, the semiconductor wafer or chip 100 represents a very small part of the slice. After appropriate cleaning using conventional well known techniques, the slice is oxidized by exposing to oxygen in a furnace at an elevated temperature of perhaps 1000 degrees centigrade to produce an oxide layer 102 of a thickness on the order of 1000 angstroms or less. Next a layer 104 of silicon nitride of perhaps 1000 angstroms or less is formed by exposing to an atmosphere of dichlorosilane and ammonia in a reactor. A coating 106 of photoresist is applied to the entire top surface of the slice and is then exposed to ultraviolet light through a mask which defines the desired pattern and the photoresist is then developed. This leaves areas 108 where the nitride is to be etched away and where field oxide 110 is to be grown. The slice is subjected to a plasma etch which removes the part of the nitride layer 104 not covered by the exposed photoresist 106. The etch does not remove the oxide layer 102 and does not react with the photoresist 106. The slice is next typically subjected to an ion implant step whereby boron atoms are implanted in the areas 108 of silicon not covered by the photoresist 106. The photoresist 106 masks the implant. Boron is an impurity which produces p-type conductivity so a more heavily doped p+ region 109 is produced on the surface of the substrate 100. The oxide layer 102 is left in place during the implant step because it prevents the implanted boron atoms from outdiffusing from the surface during subsequent heat treatment steps. The boron implant may typically be a dosage of $4 \times 10^{12}$ atoms per cm at 100 kev. After the implant the photoresist layer 106 is removed. The implanted regions 109 will ultimately form the p+ channel stop region 112.

As described in U.S. Pat. No. 4,055,444 issued to G. R. Mohan Rao, assigned to Texas Instruments, the next step in the process is to subject the slice to a heat treatment or annealing step during which the slice is maintained at a temperature of about 1000 degree C. for approximately two hours in an inert atmosphere, preferably nitrogen. This step causes the boron concentration to change markedly which has desirable effects aside from reduction in bulk damage in the crystal structure caused by the implant. The P+ channel stop regions 112 will have penetrated into the silicon surface after the anneal step.

Figure 8C:
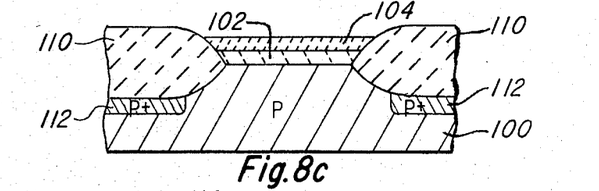
Figure 8D:
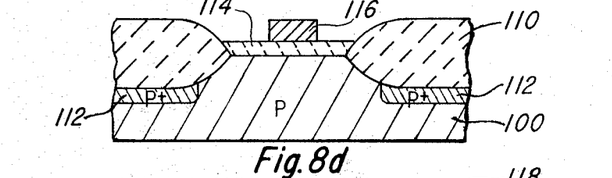
Figure 8E:
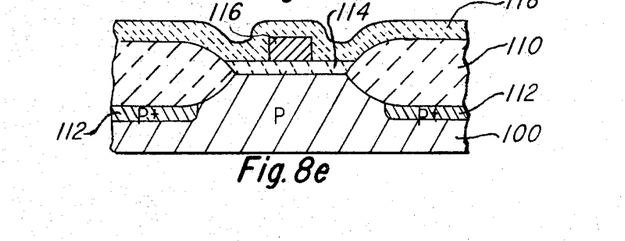

The following step in the process is formation of the field oxide 110, which is done by subjecting the slices to steam or an oxidizing atmosphere at about 900 degrees C. for perhaps 10 hours. As can be seen in FIG. 8c, this causes a thick field oxide region 110 to be grown. This region extends into the silicon surface because silicon is consumed as it oxidizes. The nitride layer 104 masks oxidation beneath it. The thickness, of the field oxide layer 110 may typically be on the order from 8,000 to 10,000 angstroms in thickness, half of which is above the original surface of the silicon substrate 100 and half below. The boron doped p+ region 109 as previously implanted and modified by the anneal step will be partly consumed but will also diffuse further into the silicon ahead of the oxidation front; thus the p+ regions will form the channel stop 112.

The nitride layer 104 and its underlying oxide layer 102 may then be removed by etching, and another thin silicon oxide layer 114 of less than 1000 angstroms and preferably, in accordance with the present invention, about 100-200 angstroms is grown over the exposed areas of silicon.

At this time, additional steps may be carried out to create desired threshold or operating parameters in transistors in the peripheral circuits such as decoders output buffers, input latches, buffers, clock generators and the like. Further, windows for first level polysilicon to substrate contacts are patterned and etched using photoresist removing the gate oxide layer 114 in selected areas. These steps are conventional in the art and are not shown in the present drawings.

Next, a layer of polycrystalline silicon is deposited over the entire slice in a reactor using standard techniques; for example, by decomposition of silane and hydrogen in about 930 degrees C. to a thickness of about one-half to one micron producing the polysilicon which will ultimately form a first level polycrystalline silicon electrode. The layer of polycrystalline silicon is subjected to a phosphorus deposition and diffusion to render it highly conductive, using conventional techniques well known in the art. This diffusion does not penetrate the substrate 100, except in regions where a polycrystalline silicon to silicon contact area might be required.

The polycrystalline silicon layer is next patterned to define an electrode 116. An insulating layer 118 is then formed to overlie at least the electrode 116. The insulating layer 118 may advantageously comprise deposited silicon oxide. This may be deposited by conventional low temperature reaction process using chemical vapor techniques. The layer 118 may be formed several thousand angstroms in thickness, preferably the layer 118 would be at least 1000 angstroms. The layer 118 conforms to the geometry of the electrode 116 and adheres to the side walls thereof. The insulating layer 118 could also be formed by conventional thermal oxidation techniques.

Figure 8F:
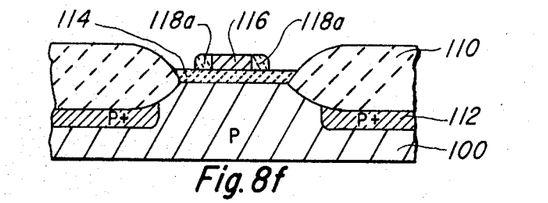

As illustrated in FIG. 8f, the insulating layer is anisotropically removed resulting in a structure such that the electrode 116 has a relatively thick insulating layer 118a remaining on the side wall or edges of the electrode. By way of illustration, if the thickness of the insulating layer 118 were 5,000 angstroms, the lateral thickness of the insulating layer 118a would also be on the order of 5,000 angstroms. The insulating layer 118 may be anisotropically removed by various techniques; preferably an anisotropic etch is used which preferentially etches the oxide 118 in only the vertical direction without any significant undercutting or lateral etch. A suitable etch is described in copending pattent application Ser. No. 146,393 filed in the name of Vernon Ray Porter, assigned to Texas Instruments Incorporated and filed on even date herewith. In this copending patent application, it is disclosed that an anisotropic oxide etch consists of a gas phase including a mixture of $C_3F_8$ or similar perfluoro compound along with $CF_4$ as a polymerization suppressant. The etch may be carried out with an RF power from 300 to 1000 watts in a flat plate reactor which creates the plasma in a vacuum of from 1 to 0.1 torr. Alternatively, ion milling can be used to achieve a structure with no undercut or lateral diffusion whereby the ion beam is adjusted vertically with respect to the surface to be milled. Another alternative includes using reactive ion etching, which may be carried out in a flat plate plasma reactor wherein the hot plate (i.e. where the RF is connected) is underneath the ground plate. In this configuration the slices would sit on the RF hot substrate instead of the ground plate as used in some other conventional techniques. This technique is described in more detail in the article "Preferential Silicon Dioxide Etching on Silicon Substrate by Plasma Reactive Sputter Etching" by Matsuo and Takehara in the Japan Journal of Applied Physics, Vol. 16, 1977, No. 1, pp. 75 and 176 and also in Lehmann and Widmer article "Fabrication of Deep Square Wave Structures with Micron Dimensions by Reactive Sputter Etching", Applied Physics Letter, 32 (3) 1 Feb. 1978, pp. 163, 164 and 165. Still a further alternative is to implant argon into regions of the insulating layer 118 that it is desired to remove and then subjecting the structure to a suitable wet etch, such as a buffered HF etch. The implanted regions will etch preferentially due to the higher etch rate in the oxide regions which are damaged by the argon implant.

Figure 8G:
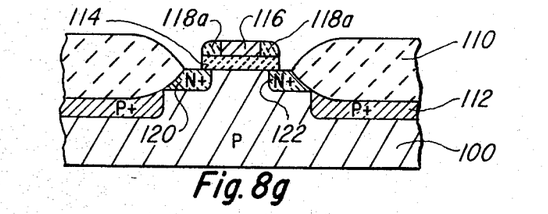

With reference now to FIG. 8g, an ion implant step can be carried out to form source and drain regions 120, 122 of an MOS transistor. Preferably arsenic is used as the dopant during the implant step since it has a relatively heavy mass and produces a shallow junction. For small geometry devices, it is advantageous to have source and drain regions on the order of 1500 angstroms or less in depth. Other suitable dopants such as antimony could be used. With reference to FIG. 8g, it can be seen that the relatively thick insulating regions 118a formed at the edge of the gate 116 act as a barrier to the ion implant so that neither of the doped regions 120 or 122 extend beneath the gate 116. As explained with respect to FIG. 1, this produces numerous advantages in device performance and fabrication yield.

With reference now to FIGS. 9a-9h, a process in accordance with the present invention is described which can advantageously be utilized to form structures which require overlapping and adjacent electrodes which must be separated by an insulating layer. In accordance with the invention, this process permits forming a relatively thick insulating layer to laterally separate adjacent adjacent and overlapping electrodes or conductors, thereby significantly reducing interlevel shorts in these types of structures. This process may for example be utilized to form a structure such as illustrated in FIGS. 3 and 7 of the drawings.

Figure 9A:
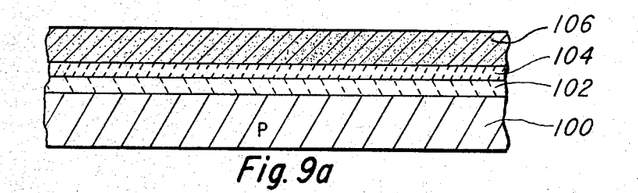
FIGS. 9–9h illustrate a process in accordance with the present invention suitable for manufacturing the structures shown in FIGS. 3 and 7.
Figure 9B:
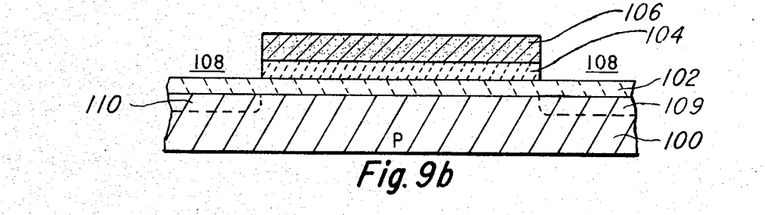
Figure 9C:
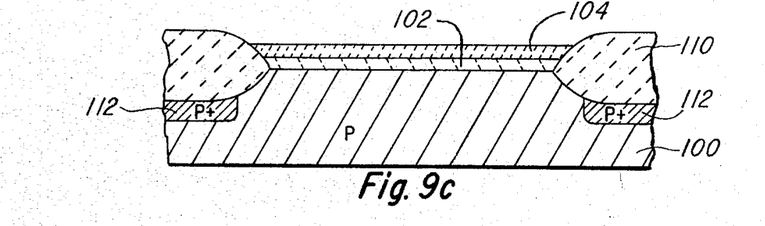
Figure 9D:
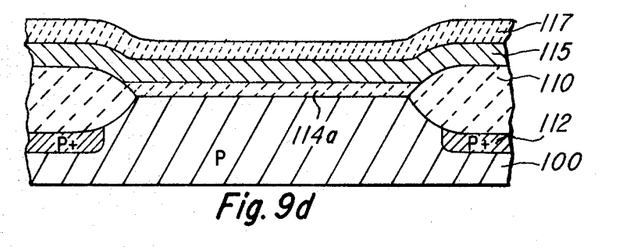
Figure 9E:
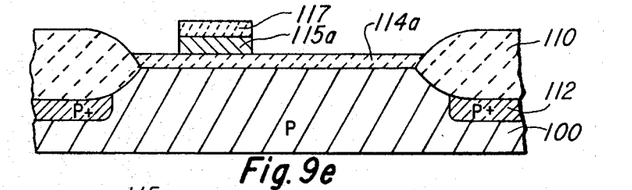

With respect to this embodiment, the process steps describe with respect to FIGS. 8a, b and c are carried out and are shown in FIGS. 9a, b, and c. The oxide layer 102 and the nitride layer 104 are removed and a new oxide layer 114a is grown by suitable thermal oxidation techniques. A polysilicon layer 115 is then deposited over the slice and doped to be highly conductive using conventional techniques. A layer of silicon oxide is next formed over the entire slice; preferably this layer is deposited by low pressure chemical vapor deposition techniques. The resultant structure is illustrated in FIG. 9d. Next a layer of photoresist is formed over the slice and the oxide layer 117 and the doped polysilicon layer 115 are patterned as illustrated in FIG. 9e. Preferably an anisotropic etch such as described in the aforementioned copending patent application of Vernon R. Porter is used to pattern the silicon dioxide layer 117 and the polysilicon layer 115. As described in the aforementioned patent application, a suitable etch for the polysilicon material may comprise carbon tetrachloride in nitrogen or other inert gas together with a small amount of hydrogen chloride gas as an arc suppressant. The plasma etching takes place with an RF power of between 300 watts and 1000 watts at a pressure of between 0.1 torr and 1 torr. The silicon oxide etch may comprise a mixture of $C_3F_8$ or similar perfluoror compound and $CF_4$ as a polymerization suppressant under similar plasma etching conditions. Other suitable anisotropic techniques can be used to pattern these layers as described with reference to FIG. 8f.

Figure 9F:
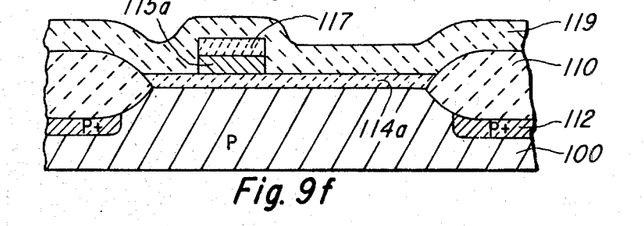
Figure 9G:
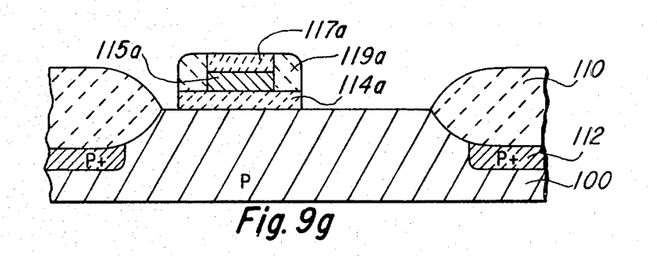
Figure 9H:
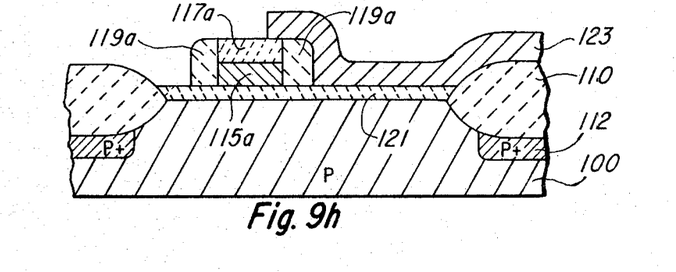

As illustrated in FIG. 9f, an additional insulating layer 119 is formed over the electrode 115a and is overlying oxide layer 117a. The purpose of the insulating layer 117a over the electrode 115a is to further increase interlevel electrode isolation. The insulating layer 119 is preferably deposited silicon dioxide using conventional techniques. The layer 119 is next anisotropically removed in a manner similar to that described with respect to FIG. 8f producing an electrode 115a having a relatively thick insulating layer 119a formed on the side edge and an insulating layer 117a' on its top surface. The thickness of 117a' is less than that of 117a due to the fact that in ansotropically removing the material 119, all of the insulating material down to the surface of the substrate is removed including the thickness of the thin insulating layer 114a. Next a new thin insulating layer 121 is grown by thermal oxidation techniques and a second level polysilicon electrode 123 is formed and patterned. As can be seen the relatively thick insulating region 119a laterally isolates the electrode 115a from 123. Further the relatively thick region 119a protects the edge of the gate electrode 115a from contamination during sequent processing and reduces the effect of thermal oxidation underneath the edge of the gate electrode 115a during formation of the new insulating layer 121.

While the present invention has been described with respect to silicon gate devices, it will be apparent to those skilled in the art that any suitable electrode can be used in accordance with the present invention, such as metal gate structures (including refractory metals), silicide structures such as titanium silicide or molydenum silicide, or sandwich gate structures, such as a composite gate electrode formed partially by polysilicon material and partially by a material such as titanium silicide or molydenum silicide. Further, while the invention has been described with reference to specific illustrated embodiments, it will be understood by those skilled in the art that other variations can be used, and modifications to the illustrated embodiments, as well as other embodiments of the invention, will be apparent to persons skilled in the art.

What is claimed is:

1. In a method for manufacturing a device, the steps comprising:
    forming a conductive layer on a substrate;
    patterning said layer to form at least one electrode having a top surface and side wall regions;
    forming a conformant insulating layer over the top surface and side wall regions of said at least one electrode; and
    anisotropically removing said insulating layer except from said side wall regions.

2. In a method for manufacturing a device, the steps comprising:
    forming a conductive layer on a substrate;
    patterning said layer to form at least one electrode having a top surface and side wall regions;
    forming a conformant insulating layer over the top surface and side wall regions of said at least one electrode; and
    removing substantially all of said insulating layer except that portion formed on the side wall of said electrode.

3. In a method for manufacturing a device, the steps comprising:
    forming a conductive layer on a substrate;
    patterning said layer to form at least one electrode having a top surface and side wall regions;
    forming a conformant insulating layer over said at least one electrode; and
    anisotropically removing portions of said insulating layer such that portions of said insulating layer formed on the side wall of said electrode remains substantially intact while other portions of said insulating layer are removed.

4. A method for making a semiconductor device comprising the steps of:
    forming an insulating layer upon a semiconductor substrate;
    forming a conductive layer upon said insulating layer;
    forming a first insulating layer upon said conductive layer;
    patterning said conductive layer and said first insulating layer with an anisotropic plasma etch such that the remaining portions of said conductive layer and said first insulating layer have substantially vertical edges which are substantially coplanar with each other;
    forming a second insulating layer upon said device; and
    forming insulating regions along said edges of said conductive layer by subjecting said second insulating layer to an anisotropic etch which etches perpendicular to the surface of said substrate.

5. A method according to claim 4, wherein said conductive layer is polycrystalline silicon and said thin insulating layer, said first insulating layer and said second insulating layer are silicon dioxide.

6. A method for manufacturing a semiconductor device comprising the steps of:
    forming a first relatively thin insulating layer on the surface of a semiconductor substrate;
    forming a conductive layer upon said insulating layer;
    patterning said conductive layer to define a gate electrode having a top surface and side wall regions;
    forming a second insulating layer over said gate electrode;
    anisotropically removing portions of said second insulating layer such that said second insulating layer is removed from all portions except said side wall regions of said gate electrode;
    ion implanting impurities into the surface of said semiconductor substrate, said gate electrode and said second insulating layer on the side wall thereof forming a mask against said ion implantation thereby producing a doped region in the surface of said substrate, the edge of which is laterally spaced from said gate electrode.

7. A method for manufacturing a semiconductor device comprising the steps of:
    forming a first relatively thin insulating layer on the surface of a semiconductor substrate;
    forming a conductive layer upon said first insulating layer;
    forming a second relatively thick insulating layer to overlie said conductive layer;
    patterning said second insulating layer and said first conductive layer to define a first gate electrode which is separated from said substrate by said first relatively thin insulating layer, the top surface of said first gate electrode being covered by said second insulating layer;
    forming a third conformant insulating layer to overlie said gate electrode and the portion of said second insulating layer remaining on its top surface;
    anisotropically removing said third insulating layer except from the side walls of said gate electrode and its overlying insulating layer;
    removing said first insulating layer from all portions of said substrate except that portion covered by said first gate electrode and said relatively thick insulating region formed on the side wall thereof;
    forming a second relatively thin insulating film on said substrate;
    forming a second conductive layer to overlie said second insulating layer and at least a portion of said first gate electrode, said first gate electrode and the second conductive layer being laterally separated by said relatively thick insulating layer remaining of the side wall of said first gate electrode.

* * * * *